United States Patent [19]

De Jong et al.

[11] Patent Number: 5,448,063
[45] Date of Patent: Sep. 5, 1995

[54] ENERGY FILTER WITH CORRECTION OF A SECOND-ORDER CHROMATIC ABERRATION

[75] Inventors: Alan F. De Jong; Johan G. Bakker, both of Eindhoven, Netherlands; Harald Rose, Darmstadt, Germany

[73] Assignee: U.S. Philips Corporation, New York, N.Y.

[21] Appl. No.: 246,534

[22] Filed: May 20, 1994

[30] Foreign Application Priority Data

May 21, 1993 [EP] European Pat. Off. ............ 93201459

[51] Int. Cl.6 .............................................. H01J 49/46
[52] U.S. Cl. ...................... 250/305; 250/396 ML
[58] Field of Search ........................ 250/305, 396 ML

[56] References Cited

U.S. PATENT DOCUMENTS 4,740,704 4/1988 Rose et al. ............... 250/396 ML
5,177,361 1/1993 Krahl et al. ...................... 250/305

OTHER PUBLICATIONS

S. Lanio and H. Rose, "Test and improved design of a corrected imaging magnetic energy filter", Optic, vol. 73, No. 2 (1986), pp. 56–68.

*Primary Examiner*—Jack I. Berman
*Attorney, Agent, or Firm*—Leroy Eason

[57] ABSTRACT

An imaging symmetrical energy filter (of the Ω-type) comprising two pairs of sector magnets (1), (2), (3), (4) for an electron microscope. The second-order chromatic aberration is corrected by arranging the two pairs of sector magnets {(1),(4) and (2),(3)} further apart. This enables suitable arrangement of the coils to generate correction hexapole fields, so that the chromatic error is even completely eliminated. Moreover, correction of the third-order aperture aberration is also possible by constructing the hexapole coil (9) in the symmetry plane also as an octupole coil. Further correction of this third-order aberration is achieved by applying an octupole field (5) directly at the entrance of the first sector magnet (1) and an octupole field (13) directly at the exit of the fourth sector magnet (4).

6 Claims, 2 Drawing Sheets

ENERGY FILTER WITH CORRECTION OF A SECOND-ORDER CHROMATIC ABERRATION

BACKGROUND OF THE INVENTION

1. Field of the Invention

The invention relates to a particle-optical instrument, comprising a particle source for producing electrically charged particles which move along an optical axis of the instrument, an energy filter with an optical axis, an initial portion and an end portion of which coincide with the optical axis of the instrument, which energy filter comprises successively a first, a second, a third and a fourth sector magnet, the distance between the first and the second sector magnet being equal to the distance between the third and the fourth sector magnet, the optical axis being mainly circular with a radius of curvature $R_0$ within said sector magnets, and also comprising a first correction magnet for generating a hexapole field between the first and the second sector magnet, and a second correction magnet for generating a hexapole field between the third and the fourth sector magnet.

2. Description of the Related Art

An energy filter for use in a particle-optical apparatus as described above is known from a publication in "Optik", Vol. 73, No. 2 (1986), pp. 56–68, entitled "Test and improved design of a corrected imaging magnetic energy filter", by S. Lanio and H. Rose. The cited article, notably section 3.2, describes an energy filter in which a number of second-order image aberrations are corrected by means of magnetic hexapole fields.

In a particle-optical apparatus such as a transmission electron microscope, particles (electrons) can be inelastically scattered by a specimen to be examined. Generally speaking, these electrons do not contribute to image contrast, but cause noise or a reduction of contrast in the specimen image formed by the microscope. Elimination of such electrons from the image-forming electron beam will result in improved image quality. This can be realised by means of an energy filter in which a selection slit is arranged in an energy-dispersive location on the optical axis in order to select a given energy window. In some cases it is also important that the local composition of a specimen can be determined. To this end, use can be made of an imaging spectrometer whereby the energy distribution in the imaging electron beam can be measured; the energy spectrum thus measured provides information regarding the structure of the specimen point considered and also regarding its chemical composition. Furthermore, it is sometimes desirable to select a given band from the energy spectrum in order to form an image exclusively by means of the particles of this energy. For both cases, i.e. for energy selection as well as for spectrometry, use can be made of a spectrometer in which the electrons successively traverse a first, a second, a third and a fourth magnetic field. Each of these fields is generated by a sector magnet in which the path of the electrons is shaped as a sector of circle. The dispersive effect of the filter is achieved by these magnetic fields.

A non-inverting filter which can be readily built into the column of an electron microscope can be constructed by using four magnetic fields. A filter with dispersive magnetic fields exhibits image aberrations which reduce the quality of the filter. A number of image aberrations can be corrected in known manner by introducing symmetry in the arrangement of the sector magnets or by imparting a given curvature to the poles of the magnets. From the cited article it is also known to correct the geometrical second-order aberrations by means of magnetic hexapole fields. To this end, the cited article proposes to generate hexapole fields between the first and the second sector magnet as well as between the third and the fourth sector magnet. These hexapole fields enable correction of a number of second-order geometric image aberrations, but not all second-order image aberrations. Notably the second-order chromatic aberration in the direction of dispersion (also known as the "oblique spectrum plane") is not reduced by this correction method. Consequently, deviations from the ideal beam path occur notably in the energy selection plane. Therefore, the use of the known filter is not very attractive for spectroscopy purposes.

SUMMARY OF THE INVENTION

It is an object of the invention to render a falter of the kind described suitable for use as an imaging filter as well as a spectroscope. To this end, the filter in accordance with the invention is characterized in that the distance between the first and the second sector magnet and between the third and the fourth sector magnet is greater than 1.9 times the radius of curvature, of the axis.

The invention is based on recognition of the fact that in the configuration of the sector magnets thus obtained the coils for generating the hexapole fields can be arranged in such a manner that the second-order geometric imaging aberrations mentioned in the prior art as well as the second-order chromatic aberration in the energy-dispersive plane can be corrected to a significant extent. It has been found notably that when one of the three coils is arranged as near to the second (or third) sector magnet as possible, said second-order aberration can be corrected to a great extent. It is an additional advantage of the steps of the invention that the dispersion of the filter thus formed is increased by some tens of percents, so that the suitability of this filter for use as a spectroscope is further increased.

It is particularly advantageous to choose a value of between two and five times the radius of curvature of the axis for the distance between the first and the second sector magnet and between the third and the fourth sector magnet. When such a distance is chosen between the sector magnets, said second-order chromatic aberration can be made exactly equal to zero.

It cannot be precluded that increasing the distance between the first and the second sector magnet and between the third and the fourth sector magnet introduces other aberrations of higher order, for example third-order geometric aperture aberrations in the energy selection plane. Correction of the latter aberrations can be realised in that there is provided a correction magnet for generating an octupole field in the symmetry plane between the second and the third sector magnet. The resolution of the filter is thus further enhanced.

A further correction of said third-order aberration is realised in that a second and a third correction magnet are provided so as to produce an octupole field directly in front of the first sector magnet and directly behind the fourth sector magnet, respectively.

BRIEF DESCRIPTION OF THE DRAWINGS

The invention will be described in detail hereinafter with reference to Figures. Therein.

DESCRIPTION OF THE PREFERRED EMBODIMENTS

Figure 1:
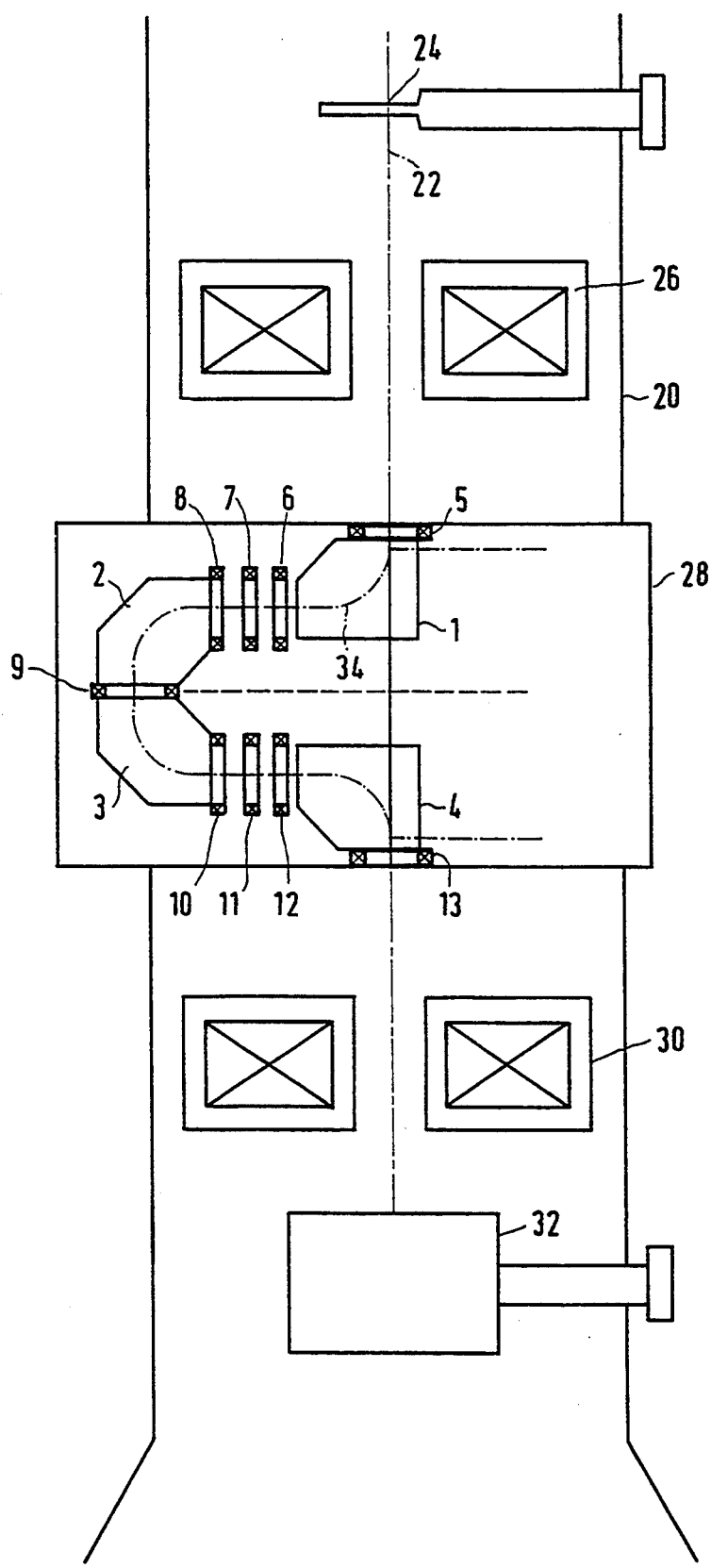
FIG. 1 shows diagrammatically an electron microscope comprising an energy filter in accordance with the invention.

FIG. 1 shows part of a particle-optical instrument, here in the form of a column 20 of an electron microscope. As is usual, a beam of electrons is produced in this instrument by an electron source (not shown in the Figure), which beam extends along the optical axis 22 of the instrument. The electrons traverse a specimen 24 and can be inelastically scattered therein. The electron beam traversing the specimen can be focused by one or more electromagnetic lenses, for example the lens 26, after which the electron beam reaches the filter 28.

The filter 28 comprises four sector magnets 1, 2, 3 and 4, in each of which the electron beam is deflected through 90°. During deflection energy dispersion occurs, enabling selection of electrons of a desired energy from the electron beam. The electron beam enters the sector magnet at a given angle relative to the boundary of the sector magnet. The choice of the size of this angle is dependent on the distance desired between the sector magnets; this angle can be determined without objectionable experimentation, for example by means of a computer simulation program. Such a program is commercially available as "GIOSP" and is marketed by "Bender & Przewloka", EDV-consultants", Giessen, Germany.

Aberrations occur during the traversing of the sector fields, aberrations of the second order and, to a lesser extent, those of the third order disturbing the imaging of the filter, so that they need be corrected. To this end there are provided a number of correction coils 5, 7, 8, 9, 10, 11 and 13 for the correction of second-order and third-order aberrations as will be described in detail hereinafter with reference to FIG. 2.

After emanating from the filter 28, the electron beam can be focused further by one or more lenses, for example the lens 30, after which detection and possibly recording of the electron beam can take place in the detector 32.

Figure 2:
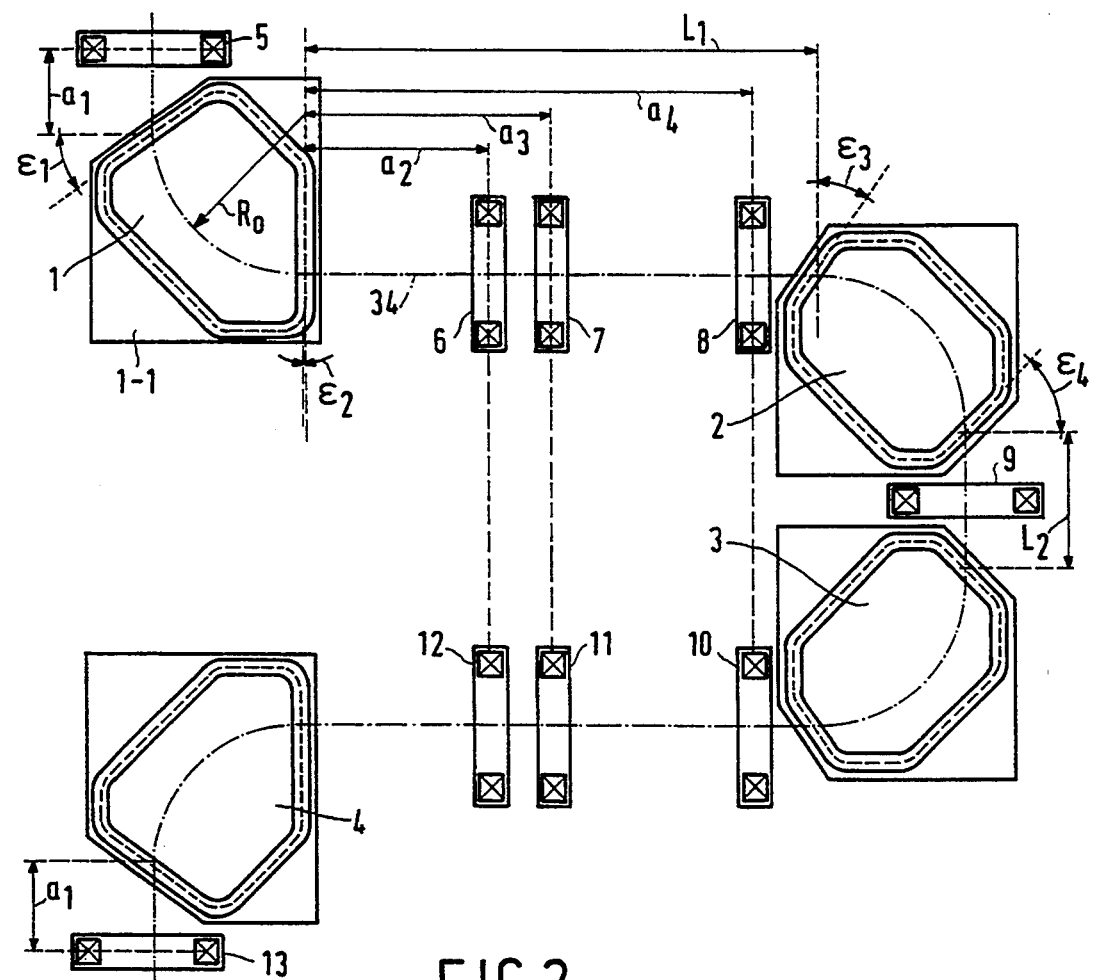
FIG. 2 is a more detailed representation of an energy filter in accordance with the invention.

FIG. 2 is a more detailed representation of the energy filter 28. The electron beam is deflected through 90°, in each of the sector magnets 1, 2, 3 and 4, so that the optical axis, and hence the electron beam, is shaped as the letter Ω; therefore, filters of this type are also known as Ω-filters. It is to be noted that for the present invention it is not essential that the deflection of the electron beam is exactly 90°; other values are also feasible, be it that the locations of the correction coils will then be slightly different.

The radius of curvature of the deflection is referred to as $R_0$. Each sector magnet comprises a magnetic termination such as the termination 1-1 of the sector magnet 1. This magnetic termination, being known per se, has a magnetostatic potential equal to zero and is provided for suitable definition of the magnetic field at the edge of the sector magnets. Within the context of the present invention, the boundary plane of the magnetic field is defined as the plane extending perpendicularly to the plane of the drawing extending through the centre of the space between the magnet pole and the pole of the magnetic termination. The energy filter also comprises a number of correction coils for generating hexapole fields, octupole fields or a combination thereof. In the context of the present invention the centre of the physical coil is defined as the location of a magnetic field generated by a correction coil. The physical construction of these coils will be described in detail with reference to FIG. 3.

In the energy filter imaging aberrations of the second and the third order occur which need be corrected by said correction fields. The coils 5, 6, 7, 8, 9, 10, 11, 12 and 13 are provided to generate hexapole fields; second-order imaging aberrations are counteracted thereby. The coils 5, 9 and 13 are also provided to generate octupole fields whereby third-order aberrations are corrected.

A number of second-order imaging aberrations is corrected in combination by the coil pairs (6, 12), (7, 11) and (8, 10) and the coil 9. Because of its location in a symmetry plane of the filter, the latter coil may be considered as a contraction of two imaginary coils. A computer simulation of the imaging properties of the filter has shown that for correction of the second-order chromatic aberration in the dispersion direction the distance between the sector magnets 1 and 4 on the one side and the sector magnets 2 and 3 on the other side is preferably greater than that in the cited prior art. By a suitable choice of the location of the correction fields, said chromatic aberration can then be made so small that it becomes negligible for practical purposes. This appears to be the case for a distance $L_1$ between the sector magnets amounting to 1.9 times the radius of curvature of the axis, so $1.9*R_0$. If full correction of said chromatic aberration is desired, it appears that the distance $L_1$ must be larger than $2*R_0$, preferably between two and five times the radius of curvature of the axis, because stigmatic imaging with the filter is no longer possible with $L_1 > 5R_0$. In both cases (i.e. $L_1 \approx 1.9R_0$ and $L_1 \geq 2R_0$ optimum correction of the relevant aberration is obtained if the distance between the coil 8 and the sector 2 (or the coil 10 and the sector 3) is minimized. Correction can be optimized by varying the location and the energizing of the coils 6 and 7 (or 11 and 12). This experimental variation can be executed by means of the previously mentioned simulation program.

In given circumstances (depending on the choice of the further filter parameters), it may occur that the third-order aberrations are increased by the increasing of the distance $L_1$ and hence need further correction. To this end, the correction coils 5, 9 and 13 are designed so that they also generate octupole fields whereby these image aberrations are corrected. For optimization of correction it appears to be advantageous to minimize the distance between the coil 5 and the sector field 1 (or the coil 13 and the sector field 4).

The values of the various parameters of a practical embodiment of the filter in accordance with the invention are given in the below Table. The Table represents two situations, i.e. the situation A and the situation B; in the situation A the distance $L_1$ between the sector magnets 1 and 2 equals $2R_0$; in the situation B, this distance equals $3.3R_0$.

| parameter | A | B |
| --- | --- | --- |
| $L_1$ | 2.0 | 3.3 |
| $L_2$ | 0.725 | 0.9 |

-continued

| parameter | A | B |
| --- | --- | --- |
| $a_1$ | 0.4 | 0.45 |
| $a_2$ | 1.0 | 1.2 |
| $a_3$ | 1.35 | 1.6 |
| $a_4$ | 1.6 | 2.9 |
| $\epsilon_1$ | 41.9° | 35.9° |
| $\epsilon_2$ | −5.4° | 0.8° |
| $\epsilon_3$ | 40.2° | 34.1° |
| $\epsilon_4$ | 25.8° | 41.2° |

In this Table the entrance angle between the optical axis and the boundary plane at the entrance side of the sector magnet 1 is represented by $\epsilon_1$, the exit angle at the sector magnet by $\epsilon_2$, and the corresponding angles for the sector magnet 2 by $\epsilon_3$ and $\epsilon_4$, respectively. The distances from the sector magnets are taken as from the point of intersection between the optical axis and the relevant boundary plane. The distance between the coil 5 and the sector magnet 1 is denoted by the reference $a_1$, whereas the distances between this sector magnet and the coils 6, 7 and 8 are denoted by the references $a_2$, $a_3$ and $a_4$, respectively. The distance between the sector magnet 1 and the sector magnet 2 is denoted by the reference $L_1$, whereas the distance between the sector magnets 2 and 3 is denoted by the reference $L_2$. All distances in the Table are expressed in units of $R_0$.

Figure 3:
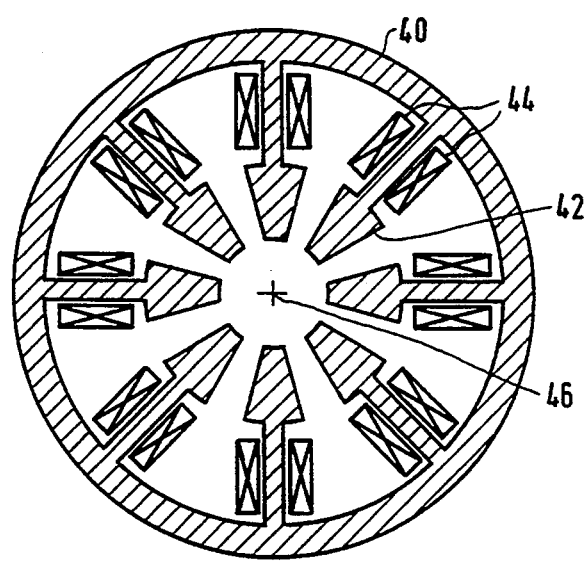
FIG. 3 shows an embodiment of a correction magnet suitable for generating hexapole as well as octupole fields.

FIG. 3 shows an embodiment of a coil whereby hexapole as well as octupole fields can be generated. This coil consists of eight poles 42, each pole comprising its own energizing coil 44. Each pole is magnetically connected to a closing member 40 for closing the magnetic circuit. Any hexapole field and any octupole field can be generated by suitable energizing of the coils 44 (which can be independently energized).

We claim:

1. A particle-optical instrument, comprising a particle source for producing electrically charged particles which move along an optical axis (22) of the instrument, an energy filter (28) with an optical axis (34), an initial portion and an end portion of which coincide with the optical axis (22) of the instrument, which energy filter (28) comprises successively a first, a second, a third and a fourth sector magnet (1), (2), (3), (4), the distance ($L_1$) between the first (1) and the second (2) sector magnet being equal to the distance between the third (3) and the fourth (4) sector magnet, the optical axis (34) being mainly circular with a radius of curvature $R_0$ within said sector magnets, a first correction magnet (8) for generating a hexapole field between the first and the second sector magnet, and a second correction magnet (10) for generating a hexapole field between the third and the fourth sector magnet, in which the distance ($L_1$) between the first and the second sector magnet and between the third and the fourth sector magnet is greater than 1.9 times the radius of curvature $R_0$ of the axis.

2. A particle-optical instrument as claimed in claim 1, in which the distance between the first (1) and the second (2) sector magnet and between the third (3) and the fourth (4) sector magnet is between two and five times the radius of curvature $R_0$ of the axis.

3. A particle-optical instrument as claimed in claim 1, in which a correction magnet (9) is provided to generate an octupole field in the symmetry plane between the second (2) and the third (3) sector magnet.

4. A particle-optical instrument as claimed in claim 2, in which a second (5) and a third (13) correction magnet are provided so as to produce an octupole field directly in front of the first sector magnet (1) and directly behind the fourth sector magnet (4), respectively.

5. A particle-optical instrument as claimed in claim 3, in which a hexapole field and an octupole field are generated together by only one magnetic circuit.

6. An energy filter (28) for a particle-optical instrument as defined in claim 1.

* * * * *